US012003099B2

(12) United States Patent  
Scheier et al.

(10) Patent No.: US 12,003,099 B2  
(45) Date of Patent: Jun. 4, 2024

(54) MOTOR VEHICLE CONTROL UNIT WITH REDUNDANT POWER SUPPLY, AND CORRESPONDING MOTOR VEHICLE

(71) Applicant: Conti Temic Microelectronic GmbH, Nuremberg (DE)

(72) Inventors: Ingo Scheier, Munich (DE); Christian Voss, Munich (DE); Josef Schnell, Munich (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 536 days.

(21) Appl. No.: 17/278,498

(22) PCT Filed: Sep. 20, 2019

(86) PCT No.: PCT/EP2019/075418  
§ 371 (c)(1),  
(2) Date: Mar. 22, 2021

(87) PCT Pub. No.: WO2020/064574  
PCT Pub. Date: Apr. 2, 2020

(65) Prior Publication Data  
US 2022/0037882 A1    Feb. 3, 2022

(30) Foreign Application Priority Data  
Sep. 24, 2018   (DE) .................... 10 2018 216 196.8

(51) Int. Cl.  
*G01R 31/26*   (2020.01)  
*B60R 16/03*   (2006.01)  
(Continued)

(52) U.S. Cl.  
CPC .............. *H02J 1/108* (2013.01); *B60R 16/03* (2013.01); *G01R 31/006* (2013.01);  
(Continued)

(58) Field of Classification Search  
CPC ...... B60R 16/03; G01R 31/00; G01R 31/006; G01R 31/2632; H02H 1/06; H02H 3/04;  
(Continued)

(56) References Cited

U.S. PATENT DOCUMENTS

| 7,960,861 | B2 | 6/2011 | Gscheidle et al. |
| 2004/0017642 | A1* | 1/2004 | Alappat .................. H02J 1/108 |
| | | | 361/18 |

(Continued)

FOREIGN PATENT DOCUMENTS

| DE | 10122954 A1 * | 4/2002 | ................ H02J 1/08 |
| DE | 10122954 A1 | 4/2002 | |
| DE | 102006040753 A1 | 3/2008 | |

OTHER PUBLICATIONS

German Examination Report for German Application No. 10 2018 216 196.8, dated Aug. 22, 2019, 7 pages.

(Continued)

*Primary Examiner* — Jermele M Hollington  
*Assistant Examiner* — Courtney G McDonnough  
(74) *Attorney, Agent, or Firm* — BUCHANAN INGERSOLL & ROONEY PC

(57) ABSTRACT

A control unit for a motor vehicle, having a supply connection for receiving a supply voltage from a supply line needing to be secured against a reaction from the control unit, wherein to protect against the reaction there is provision in a current path of the supply connection for a unidirectional first blocking element, and a diagnostic circuit is configured to check the blocking effect thereof by a predetermined diagnostic routine. An additional, second unidirectional blocking element is connected in series with the blocking element in the current path of the supply connection, wherein the first and the second blocking element each provide for a unidirectional flow of current to the (Continued)

device circuit, and the diagnostic circuit is configured to use the diagnostic routine to also check the blocking effect of the second blocking element.

19 Claims, 4 Drawing Sheets

(51) Int. Cl.
   *G01R 31/00* (2006.01)
   *H02H 1/06* (2006.01)
   *H02H 3/04* (2006.01)
   *H02J 1/10* (2006.01)
(52) U.S. Cl.
   CPC ........... *G01R 31/2632* (2013.01); *H02H 1/06* (2013.01); *H02H 3/044* (2013.01)
(58) Field of Classification Search
   CPC  H02H 3/044; H02H 3/05; H02H 3/18; H02H 3/20; H02J 1/10; H02J 1/108
   USPC .................................................... 324/762.07
   See application file for complete search history.

(56) References Cited

U.S. PATENT DOCUMENTS

2004/0239186 A1   12/2004  Emmerling et al.
2009/0322156 A1   12/2009  Gscheidle et al.
2018/0065579 A1    3/2018  Hayashi

OTHER PUBLICATIONS

International Search Report and Written Opinion for International Application No. PCT/EP2019/075418, dated Nov. 27, 2019, 8 pages.
International Search Report and Written Opinion for International Application No. PCT/EP2019/075418, dated Nov. 27, 2019, 13 pages (German).
Office Action (The First Office Action) issued Dec. 29, 2023, by the State Intellectual Property Office of People's Republic of China in corresponding Chinese Patent Application No. 201980062611.X and an English/German translation of the Office Action. (16 pages).

* cited by examiner

MOTOR VEHICLE CONTROL UNIT WITH REDUNDANT POWER SUPPLY, AND CORRESPONDING MOTOR VEHICLE

CROSS REFERENCE TO RELATED APPLICATIONS

This application is the U.S. National Phase Application of PCT International Application No. PCT/EP2019/075418, filed Sep. 20, 2019, which claims priority to German Patent Application No. 10 2018 216 196.8, filed Sep. 24, 2018, the contents of such applications being incorporated by reference herein.

FIELD OF THE INVENTION

The invention relates to a control unit for a motor vehicle. The control unit in this instance provides assurance that no electrical interference from the control unit can reach a supply line, as a result of which other control units connected to the supply line could otherwise experience interference. The invention also comprises a motor vehicle having at least one control unit according to the invention.

BACKGROUND OF THE INVENTION

There can be provision in a motor vehicle for a control unit to be supplied with an electrical supply voltage via multiple electrical lines. In this instance there can be provision for the control unit to be connected to a basic supply line or multiple basic supply lines via which an electrical device circuit of the control unit, for example a power supply unit, can receive an electrical basic supply voltage in each case. The basic supply voltage can be generated for example by means of an electrical generator and/or by means of a DC-DC voltage converter. In the case of a DC-DC voltage converter the basic supply voltage can be generated for example from an electrical voltage at another, for example higher, voltage level.

In order to be able to continue to operate the control unit still in the event of interference in the basic supply voltage, for example if the aforementioned generator and/or DC-DC voltage converter has/have a defect, an emergency supply line or multiple emergency supply lines can be used in each case to additionally provide an emergency supply voltage. This can be supported or buffered by a backup battery, for example in comparison with the basic supply voltage. A control unit with a redundant supply via the emergency supply line can be provided for a safety-relevant function in the motor vehicle, for example. In particular in a motor vehicle with autonomous or semiautonomous driving, that is to say in an autonomously or semiautonomously driving motor vehicle, a control unit or multiple control units for providing the autopilot function can be redundantly or additionally connected to the emergency supply line.

If the basic supply voltage fails or experiences interference, each control unit connected to the emergency supply line can be supplied with the emergency supply voltage and hence continue to be operated at least to a limited extent. If interference now additionally occurs in one of these control units, however, then it is necessary to ensure that this interference in the control unit does not cause a reaction for the emergency supply line, since otherwise any other control unit connected to the emergency supply line would be affected, that is to say the operation thereof would also experience interference. In other words, such a control unit requires the electrical emergency supply connection via which the control unit is connected to the emergency supply line to be protected against an electrical reaction in the emergency supply line. An emergency supply connection that needs to be protected against an electrical reaction can be provided in each case for each emergency supply line needing to be connected.

A respective basic supply connection can accordingly be provided for a control unit for the purpose of connecting a basic supply line. Each basic supply connection and each emergency supply connection can then be connected to a circuit input of the aforementioned electrical device circuit of the control unit via a respective dedicated current path. The current paths from each basic supply connection and each emergency supply connection thus converge at the circuit input so that the received supply voltages (at least one basic supply voltage and at least one emergency supply voltage) can be provided at the circuit input of the device circuit. This circuit input can thus result for example in the aforementioned reaction. For example if the basic supply voltage rises to an overvoltage (e.g. above 150% of the rated value) then this overvoltage can reach an emergency supply line via the current path of an emergency supply connection.

To prevent this, the respective current path of an emergency supply connection can have a diode connected in it whose forward direction points from the emergency supply connection to the circuit input.

Depending on the degree or level of protection against a reaction there can also be provision in a control unit for the blocking effect of the diode to undergo diagnosis or monitoring. This can be a requirement for example for a level according to the ASIL (Automotive Safety Integrity Level) (e.g. ASIL-B and above). Thus, if the current path of an emergency supply connection in a control unit has a diode connected in it, there can additionally be provision for a diagnostic circuit configured to monitor the blocking effect thereof, that is to say the operability of the diode.

However, a check on the blocking effect can be performed only while the control unit is starting, since during operation of the control unit the circuit input of the electrical device circuit at which the supply voltage needs to be provided must be connected both to a basic supply line and to an emergency supply line so that it is continuously possible to fall back on the emergency supply voltage during operation. Thus, if the diode develops a defect during operation, this is not detected for the remaining period of operation. If interference then occurs in the basic supply voltage in this period, this interference can be transferred to an emergency supply line through the defective diode (if said diode has lost its blocking effect).

SUMMARY OF THE INVENTION

An aspect of the invention is based on providing, in a control unit, protection from an electrical reaction from the control unit to a supply line to which the control unit is connected.

An aspect of the invention is based on a control unit for a motor vehicle, wherein the control unit has at least one electrical supply connection for receiving an electrical supply voltage from a respective electrical supply line. The control unit can thus be connected to one or more supply lines via a supply connection in each case. For example, the control unit can be connected to at least one basic supply line and/or to at least one emergency supply line in the manner described at the outset.

The control unit now needs to secure at least one supply line against a predetermined electrical reaction from the control unit. Such a reaction can be for example the aforementioned overvoltage, which could infiltrate into the control unit from a basic supply line. If for example there is provision for the basic supply voltage and the emergency supply voltage provided to be a supply voltage in the range from 9 to 15 volts in each case, an overvoltage can have a voltage value of greater than 15 volts, in particular greater than 20 volts. In principle, an aspect of the invention provides for there to be provision for at least two supply connections, at least one of which needs to be secured against the aforementioned reaction. For example, at least one basic supply line and/or at least one emergency supply line can be a supply line needing to be protected against the reaction. In particular, there can be provision for a reaction in at least one emergency supply line to be prevented. There can alternatively be provision for a reaction from the control unit to a basic supply line to be prevented. For this reason, the text below refers generally to a reaction in at least one supply line needing to be avoided, the at least one supply line being able to comprise at least one emergency supply line and/or at least one basic supply line. The reaction can comprise e.g. a flow of current from the control unit into the supply line.

The respective supply voltages (that is to say basic supply voltage and emergency supply voltage) received via each supply connection (that is to say each basic supply connection and each emergency supply connection) are brought together or provided in the control unit at a circuit input of an electrical device circuit of the control unit. In other words, the supply voltages received can be combined at the circuit input. To this end, the at least one supply connection is connected to the circuit input via a respective current path. Such a current path can be formed for example on the basis of a wire and/or a stranded wire and/or a conductor track of a circuit board. In the control unit according to an aspect of the invention, to protect the at least one supply connection against the aforementioned reaction in the respective current path of the at least one supply connection there is provision for a respective unidirectional first blocking element. "Current path of the supply connection" means that it is the current path that connects the respective supply connection to the circuit input.

The unidirectional blocking element can be a diode, for example. In general, there is provision for the blocking element to provide for a unidirectionally directed flow of current to the device circuit and a blocking effect for a flow of current to the respective supply connection. In the control unit according to an aspect of the invention, a diagnostic circuit is also provided that is configured to check the blocking effect of the blocking element by means of a predetermined diagnostic routine or diagnostic function. The control unit can thus establish or signal whether the blocking effect of the blocking element in the respective current path of the supply connection is provided or is operable.

As already explained, the diagnostic circuit cannot repeatedly perform the diagnostic routine while the control unit is operating, however, since the device circuit of the control unit would not be able to use the supply connection to receive the supply voltage for the duration of the diagnostic routine. To still prevent the aforementioned electrical reaction even in the event of a possibly undetected defect in the blocking element, according to an aspect of the invention an additional unidirectional, second blocking element is respectively connected in series with the first blocking element in the respective current path of the at least one supply connection, that is to say in the current path that connects the circuit input and the respective supply connection. In other words, there are two blocking elements or at least two blocking elements in the current path. The additional second blocking element likewise provides for the unidirectional flow of current to the device circuit. In other words, there are two blocking elements of the type described and both blocking elements have a conducting direction that is directed from the supply connection to the circuit input of the device circuit. The diagnostic circuit is configured to use the diagnostic routine to also check the blocking effect of the second blocking element.

An aspect of the invention has the advantage that two series-connected unidirectional blocking elements mean that even if one of the blocking elements loses its blocking effect, that is to say makes through-contact or shorts, a second blocking element is present that can then continue to provide the blocking effect. Thus, if the diagnostic circuit detects by means of the diagnostic routine that the first blocking element has its blocking effect and then the control unit is put into operation, the first blocking element can lose its blocking effect, that is to say for example can short or suffer another defect, during operation of the control unit and there is still a second blocking element present that can continue to ensure the blocking effect. The likelihood of a double fault occurring is far lower than the likelihood of losing the blocking effect of only one of the blocking elements.

An aspect of the invention also encompasses developments that result in additional advantages.

Since, in the case of the at least one supply connection, the current path thereof in each case has a diagnostic circuit, an aspect of the invention is described below for a single current path and the diagnostic circuit thereof. For the respective current path of any other supply connection, the corresponding diagnostic circuit can be designed in the same manner.

In one embodiment the aforementioned diagnostic circuit has an electrical network in each case for the respective current path of the at least one supply connection. An electrical network can be formed for example from discrete components or on the basis of an integrated circuit. The electrical network connects the circuit input of the device circuit (where the supply voltages converge) to a reference potential of the control unit. Such a reference potential can be for example a ground potential of the control unit.

The diagnostic routine for checking the blocking effect involves an evaluation logic of the diagnostic circuit using a switching element of the network to set two different switching states in the network. The switching element provided for this purpose can be formed for example on the basis of a switch and/or a transistor, for example a bipolar transistor or field-effect transistor. An example of a field-effect transistor (FET) is a MOSFET (metal-oxide-semiconductor field-effect transistor). The switching element can be alternately switched to an electrically conductive state and an electrically nonconductive state by the evaluation logic. This results in two switching states of the switching element that have an effect in the network regarding a distribution of the current and/or of the electrical voltage, which is why switching states of the network itself are obtained. To understand the electrical network it should be noted that at the circuit input of the device circuit it can be assumed that the supply voltage is present there because it can get there via the respective current path of at least one supply connection. It is therefore possible for the supply voltage to be taken as a basis for generating an electrical test voltage at a predetermined tap point, which is called first tap point here. When performing the diagnostic routine the evaluation logic accordingly records at the first tap point a voltage value of the first test voltage of the network that is obtained in the respective switching state of the network. The network can be of single-part or multipart, in particular two-part, design. As a two-part network it can have two separate circuit branches, e.g. two voltage dividers. Each of the two voltage values can then be recorded at a dedicated tap point, the respective voltage value then describing a separate, different test voltage. There can thus be provision for more than one "first tap point", and accordingly it is also possible for more than one "first test voltage" to be recorded.

On the basis of the two voltage values from the two switching states of the network, the evaluation logic uses a predetermined voltage coding to verify whether the first and the second blocking element has its respective blocking effect. The voltage coding can be implemented for example on the basis of a predetermined assignment rule. The assignment rule can indicate which voltage values at the at least one first tap point indicate blocking elements having a blocking effect and which voltage values indicate at least one blocking element without a blocking effect. For this purpose, the evaluation logic can store for example an appropriate table or a family of characteristic curves as assignment rule. If the verification is not successful, that is to say, otherwise, if at least one of the blocking elements does not have the blocking effect, the evaluation logic generates an error signal. On the basis of the error signal it is then possible for a safety measure to be triggered in a manner known per se, for example an emergency stop by the motor vehicle can be initiated and/or a warning signal can be output for the user of the motor vehicle.

An aspect of the invention is based on the following insight. As a result of the electrical network and the switching element thereof being used to set the two switching states, two different electrical switching situations arise. Accordingly, two different equation systems apply for the first tap point, these being able to be used as a basis for calculating the voltage value of the test voltage for each switching state. Two unknowns are obtained in these two equation systems, namely the electrical voltage dropped across each of the two blocking elements. The other elements of the electrical network are known. Two equation systems can then be used to ascertain the unknown electrical voltage dropped across each blocking element. It is thus possible to clearly establish what electrical voltage is dropped across each blocking element, from which it is possible to infer the respective blocking effect thereof. However, it is not necessary to work out this electrical voltage explicitly. It is enough to compare the two test values with predetermined comparison values or value ranges in order to ascertain whether the blocking effect of each blocking element is present. The comparison values are indicated by the voltage coding.

What is not described separately here is the fact that the network of the diagnostic circuit can be of switchable design, i.e. it can be connected to the respective current path and/or to the reference potential via a respective switch that can block a flow of current through the network while the diagnostic routine is inactive. This allows an undesirable energy consumption to be prevented.

An aspect of the invention also includes embodiments that result in additional advantages.

Preferably, there is provision for at least two supply connections of the type cited and/or there is provision for at least one additional supply connection, which can be unsecured with regard to an electrical reaction or secured simply with only a single blocking element. The diagnostic routine can include this additional supply connection as well, but this is optional.

In one embodiment there is provision for the electrical network to be connected to the current path of the supply connection at at least two contact points and in this instance for a first of the contact points to be arranged between firstly the two blocking elements and secondly the supply connection and for the second of the contact points to be arranged between the two blocking elements themselves. As a result of the network being connected to the current path at these two aforementioned contact points, the following condition is satisfied. The blocking effect of both blocking elements must be present at the first contact point if said blocking elements are operable. Only the blocking effect of one of the blocking elements is present at the second contact point between the blocking elements, even if both blocking elements are operable or undamaged. These two contact points can therefore be used to immediately distinguish the blocking effect of both blocking elements.

Preferably, the circuit input of the device circuit is electrically connected to the reference potential in both switching states of the network. Thus, neither of the switching states provides for full electrical blocking between the circuit input and the reference potential. As a result of both switching states making an electrical connection between the circuit input and the reference potential, voltage values of the aforementioned test voltage are obtained that permit a voltage coding, that is to say a multi-valued or multilevel resolution.

In one embodiment a first tap point in the electrical network, at which the evaluation logic measures the test voltage, is connected to a first measurement point of the current path, corresponding to the first contact point, via a first resistor element and to the reference potential via a second resistor element. The first resistor element and the second resistor element then act as a voltage divider. The resistor element provided for can be in each case for example a non-reactive resistor element, for example a discrete component, or in each case a circuit comprising more than one component.

In one embodiment the switching element of the network connects the circuit input (at which the supply voltage can be provided) to a feed point corresponding to the aforementioned second contact point. Thus, if the switching element is switched to an electrically conductive state, an electric current can flow from the circuit input through the switching element to the feed point, that is to say can be fed to the current path between the two blocking elements. There can also be provision in this circuit branch between the circuit input and the feed point for an additional resistor element in addition to the switching element, as a result of which a current level of the aforementioned current can be limited to a maximum value. Moreover, the potential of the feed point can be set by means of the resistor element. Provision for the aforementioned feed point allows a direct measurement of the blocking effect of one of the blocking elements to be brought about independently of the other blocking element.

The diagnostic routine already described can be performed e.g. by the aforementioned evaluation logic. In one embodiment the diagnostic routine involves the evaluation logic recording a feed voltage value when the switching element is switched to an electrically conductive state. This feed voltage value correlates with the feed voltage that is present in the aforementioned circuit branch. This is thus the circuit branch that comprises the switching element and that connects the circuit input to the feed point. The feed voltage value does not directly have to be the voltage value of the feed voltage itself, but rather the circuit branch can be connected to the reference potential via a voltage divider, for example, and the feed voltage value can be measured or recorded at a connecting point of this voltage divider. The evaluation logic can configure the aforementioned voltage coding on the basis of the recorded feed voltage value. In other words, the voltage coding can take into consideration the voltage value of the supply voltage actually provided at the circuit input. This prevents erroneous triggering based on an invalid voltage coding. Moreover, the diagnostic circuit can use a self-diagnosis to monitor the switching element for operability.

In one embodiment the first tap point, at which the evaluation logic ascertains or records the test voltage for establishing that there is the blocking effect, is connected to the aforementioned feed point via a third resistor element. Thus, the first tap point is therefore connected to the aforementioned first measurement point via a first resistor element, to the reference potential via a second resistor element and to the feed point via a third resistor element. The evaluation logic can then measure or record the aforementioned test voltage values at the first tap point. The resistor elements can form what is known as a weighted network, which can bring about the effect, or ensure, that correspondingly different test voltage values are obtained depending on the blocking effect of the two blocking elements. The choice of resistance values and/or impedance values of the resistor elements of a weighted network of this kind can be made in accordance with the prior art. As an alternative to the third resistor element there can be provision for there to be provision for a further "first tap point" that is connected to the feed point via a fifth resistor element and to the reference potential via a sixth resistor element.

In one embodiment the diagnostic circuit for the respective current path of the at least one system supply connection also provides for an interruption element of switchable design in the current path in each case. Such an interruption element can be for example a switch or transistor, in particular a field-effect transistor. Preferably, there is provision for a MOSFET, as a result of which the operation of the control unit results in a resistance value in the current path when the interruption element is switched to an electrically conductive state, said resistance value being able to be kept lower than a predetermined threshold value. The interruption element is provided between firstly the supply connection and secondly the two blocking elements. The aforementioned diagnostic routine provides for the blocking effect of the two blocking elements to be checked by virtue of the interruption element being switched to an electrically nonconductive state for at least part of the diagnostic routine, that is to say intermittently or periodically. This advantageously eliminates or interrupts the influence of the supply voltage, as can be received via the supply connection, while the diagnostic routine is being performed.

In one embodiment a second measurement point, arranged between the supply connection and the interruption element, of the current path is connected to the evaluation logic. In other words, the evaluation logic can also perform a voltage measurement at this second measurement point. The diagnostic routine accordingly involves the evaluation logic, when the interruption element is switched to an electrically conductive state, checking a conducting-state voltage dropped across the interruption element for whether the conducting-state voltage satisfies a predetermined conducting-state criterion. The conducting-state criterion is designed such that when the conducting-state criterion is satisfied the interruption element is actually electrically conductive, that is to say is not destroyed and/or permanently electrically nonconductive. If the conducting-state criterion is violated then the evaluation logic generates a failure signal. The failure signal can signal that the interruption element is inoperable. This results in the advantage that the diagnostic circuit monitors the availability of the supply voltage.

In one embodiment the diagnostic circuit has a voltage divider, connecting the second measurement point to the reference potential, that provides a second tap point. The conducting-state criterion involves a voltage difference between a second test voltage recorded at the second tap point and the first test voltage being lower than a predetermined threshold value. This results in the advantage that no direct measurement of the conducting-state voltage across the interruption element is necessary. It is enough to compare the two test voltages. This thus allows the first tap point to be used twice.

In one embodiment the aforementioned evaluation logic is configured to perform the diagnostic routine while the control unit is starting and to refrain from the diagnostic routine while the control unit is operating. This means that it is not necessary to interrupt the redundant power supply of the control unit. It is thus possible to ensure continuously redundantly secured operation of the control unit, since the supply voltage is available continuously.

In one embodiment the evaluation logic is provided on the basis of at least one microcontroller, and the evaluation logic is configured to use at least one analog-to-digital converter (AD converter) of the at least one microcontroller for a respective voltage recording provided for according to the diagnostic routine. This allows the diagnostic routine to be implemented on the basis of a program code for the at least one microcontroller. Alternatively, there can also be provision, however, for the evaluation logic to be implemented wholly or partly on the basis of at least one logic chip and/or an ASIC (application-specific integrated circuit) and/or an FPGA (field programmable gate array).

In one embodiment there is provision for the respective blocking element provided for to be in each case a diode and/or a MOSFET with body diode (which can be connected as a diode) and/or a switching unit. In this instance the switching unit is designed to be alternately switchable to an electrically conductive state and an electrically nonconductive state, the switching unit being able to be used in each case to implement the principle of what is known as an ideal diode, that is to say that if an electrical voltage at the supply connection is higher than at the circuit input of the device circuit then the switching unit is switched to an electrically conductive state and if the electrical voltage at the supply connection is lower than at the circuit input then the switching unit is switched to an electrically nonconductive state. It is thus possible to dispense with a voltage difference as in the case of the diode (for example 0.7 volt).

An aspect of the invention also includes a motor vehicle that has at least one control unit according to an aspect of the invention. The motor vehicle furthermore has at least one electrical supply line, wherein the at least one control unit is connected to the at least one supply line for an electrical supply. Preferably, the respective control unit is connected to multiple supply lines, wherein at least one of these is protected against the aforementioned reaction from the control unit. There can be provision for the at least one supply line to be connected to an electrical emergency voltage source, for example a battery, by means of which an emergency supply voltage can be provided.

The motor vehicle according to an aspect of the invention is preferably designed as a motorcar, in particular as an automobile or truck or passenger bus. The at least one control unit can be provided for operation of the motor vehicle as an autonomous motor vehicle. The respective control unit can provide for example a light control function for headlights of the motor vehicle. In other words, the device circuit of at least one control unit can provide control of headlights of the motor vehicle.

An aspect of the invention also encompasses the combinations of the features of the described embodiments.

BRIEF DESCRIPTION OF THE DRAWINGS

Exemplary embodiments of the invention are described below. In this respect.

DETAILED DESCRIPTION OF THE PREFERRED EMBODIMENTS

The exemplary embodiment explained below is a preferred embodiment of the invention. In the exemplary embodiment, the described components of the embodiment each represent individual features of the invention that should be considered independently of one another, and that each also develop the invention independently of one another and can therefore also be considered to be part of the invention, either individually or in a combination other than that shown. Furthermore, the embodiment described may be supplemented by further features of the invention that have already been described.

In the figures, elements with the same function are each provided with the same reference signs.

Figure 1:
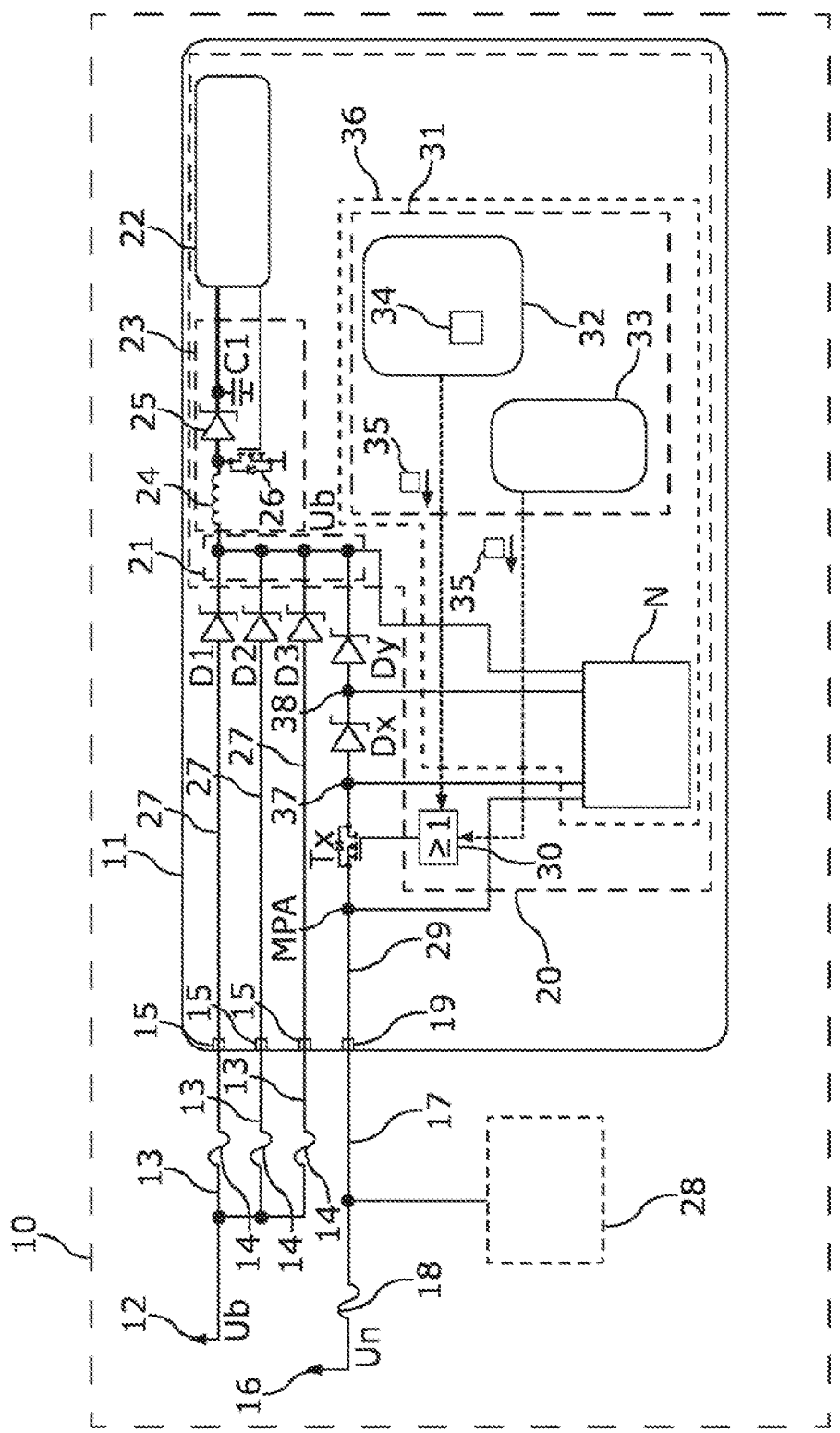
FIG. 1 shows a schematic depiction of an embodiment of the motor vehicle according to the invention with an embodiment of the control unit according to the invention.

FIG. 1 shows a motor vehicle 10, such as for example can be implemented by a motorcar (automobile or truck) or a passenger bus. There can be provision in the motor vehicle 10 for a control unit 11, which can be for example a control unit for a vehicle light, for example a headlamp or a headlamp pair. An electrical voltage source 12 can be provided in the motor vehicle 10 to operate the control unit 11. The voltage source 12 can provide a vehicle electrical system voltage, referred to here as basic supply voltage Ub. For example, the basic supply voltage Ub can be in a range from 10 volts to 60 volts, for example it can be 12 volts. The voltage source 12 can be generated by means of a DC-DC voltage converter, for example, which can generate the basic supply voltage Ub from another voltage level, for example a higher voltage level. The control unit 11 can be electrically connected to the voltage source 12 via multiple basic supply lines 13. A basic supply line 13 can be implemented for example on the basis of a wire or cable. The figure depicts how there can also be provision for an electrical fuse 14 for each basic supply line 13. Each basic supply line 13 can be connected to the control unit 11 by means of a basic supply connection 15. There can be provision on a basic supply connection 15 for example for a plug connection or screw connection.

To supply power to the control unit 11 in redundant fashion there can be provision in the motor vehicle 10 for an additional electrical emergency voltage source 16, which can be implemented for example on the basis of an electrical battery and/or at least one capacitor (double-layer capacitor). There can also be provision for the voltage sources 12, 16 to be electrically connected to one another and for this connection to be broken in the event of interference in the voltage source 12, as a result of which the emergency voltage source 16 is operated exclusively on the basis of its battery and/or its at least one capacitor. The control unit 11 can be electrically connected to the additional emergency voltage source 16 via an emergency supply line 17. The emergency supply line 17 can also be implemented for example on the basis of a wire or a cable. There can also be provision for an electrical fuse 18 in the emergency supply line 17. The emergency supply line 17 can be connected to the control unit 11 by means of an emergency supply connection 19 of the control unit 11. In this case too, there can be provision for a clamp connection or screw connection for the emergency supply line 17. The emergency supply line 17 can be used to receive an emergency supply voltage Un from the additional emergency voltage source 16 at the emergency supply connection 19.

There can be provision in the control unit 11 for the basic supply voltage Ub and the emergency supply voltage Un for operating an electrical device circuit 20. To this end, the received basic supply voltage Ub and the received emergency supply voltage Un can be brought together or combined at a circuit input 21 of the device circuit 20. When the voltage source 12 is operable the basic supply voltage Ub is therefore obtained at the circuit input 21, as indicated in FIG. 1. The circuit input 21 can have for example a power supply unit 22 connected to it that can generate an operating voltage for the device circuit 20 from the received basic supply voltage Ub. The power supply unit 22 can be implemented for example by means of an SBC (system basic chip). Voltage stabilization can be achieved by means of a step-up converter 23, via which the power supply unit 22 or the SBC can be coupled to the circuit input 21. The step-up converter 23 can have an inductance 24, a diode 25, a capacitance C1 and a switching element 26 in a manner known per se.

In contrast to what is depicted in FIG. 1 it is also possible for just one basic supply line 13 to be provided. In contrast to what is depicted in FIG. 1 it is possible for the control unit 11 to be connected to multiple emergency supply lines 17.

In order to avoid a reaction from an electrical fault in the device circuit 20 in each of the basic supply lines 13, respective current paths 27, each of which connects a basic supply connection 15 to the circuit input 21, can each have a diode D1, D2, D3 and/or another blocking element connected in them, the blocking element blocking only unidirectionally, that is to say providing for a conducting direction from the respective basic supply connection 15 to the circuit input 21 and providing for a blocking effect from the circuit input 21 to the respective basic supply connection 15.

The emergency supply line 17 is a supply line that needs to be secured against a reaction as defined by an aspect of the invention. In particular, a reaction from the control unit 11 in each emergency supply line 17 via the emergency supply connection 19 is therefore avoided in the control unit 11. This ensures that at least one other control unit 28 that is likewise supplied with power via the emergency supply line 17 cannot also experience interference or be affected as a result of a fault in a basic supply line 27 and/or a fault in the control unit 11 via the emergency supply connection 19 of the control unit 11. This prevents for example an overvoltage in one of the basic supply lines 27 from leading to an overvoltage also being caused in the emergency supply line 17 through the control unit 11.

To this end, a current path 29 connecting the emergency supply connection 19 to the circuit input 21 can contain two blocking elements Dx, Dy connected in series that both have a conducting direction directed from the emergency supply connection 19 toward the circuit input 21 and therefore have a respective blocking direction or blocking effect in the current path 29 from the circuit input 21 toward the emergency supply connection 19. The current path 29 can be implemented in each case for example on the basis of a wire and/or cable and/or a conductor track of a circuit board. A blocking element Dx, Dy can be implemented in each case for example on the basis of a diode and/or a MOSFET with body diode and/or the described circuit for an ideal diode, to cite just examples.

In this instance the control unit 11 can moreover be designed to have diagnostic capability, that is to say that it is possible to check the operability of each of the blocking elements Dx, Dy. To this end, the current path 29 can additionally contain an interruption element Tx, which can be implemented for example on the basis of a transistor, in particular a MOSFET. An OR circuit 30 can be used by an evaluation logic 31 of the control unit 11 to perform redundant triggering or switching of the interruption element Tx. There can be provision in the evaluation logic 31 for example for at least one microcontroller 32 and optionally an auxiliary microcontroller 33, which can provide an emergency functionality in the event of an error in the microcontroller 32. The OR circuit 30 can be implemented on the basis of at least one logic chip and/or on the basis of diodes and/or transistors in a manner known per se.

During operation of the device circuit 20 the interruption element Tx can be permanently switched to an electrically conductive state, as a result of which both the basic supply voltage Ub and the emergency supply voltage Un are available at the circuit input 21. When the control unit 11 is switched on, the interruption element Tx can be switched to an electrically nonconductive state at least temporarily for a diagnostic routine 34 that can be performed by the evaluation logic 31, this being able to be implemented for example by means of a respective blocking signal 35 from the evaluation logic 31. In the electrically nonconductive state of the interruption element Tx the emergency supply voltage Un is decoupled from the blocking elements Dx, Dy.

A diagnostic circuit 36 can then be used to ascertain the respective blocking effect of each of the blocking elements Dx, Dy singly or separately or individually. To this end, an electrical network N of the diagnostic circuit 36 can be connected between firstly the two blocking elements Dx, Dy and secondly the emergency supply connection 19 at a first contact point 37 in the current path 29, the first contact point 37 also being arranged between firstly the two blocking elements Dx, Dy and secondly the interruption element Tx. Furthermore, the diagnostic circuit 36 can be connected to the current path 29 at a second contact point 38 in the current path 29, the second contact point 38 being arranged between the two blocking elements Dx, Dy. Furthermore, the network N can be electrically connected to the circuit input 21 in order to receive the basic supply voltage Ub. Finally, to test or check the switching capability or functionality of the interruption element Tx there can be provision for a further electrical connection from the diagnostic circuit 36 to a first measurement point MPA that can be provided for between the emergency supply connection 19 and the interruption element Tx in the current path 29.

Figure 2:
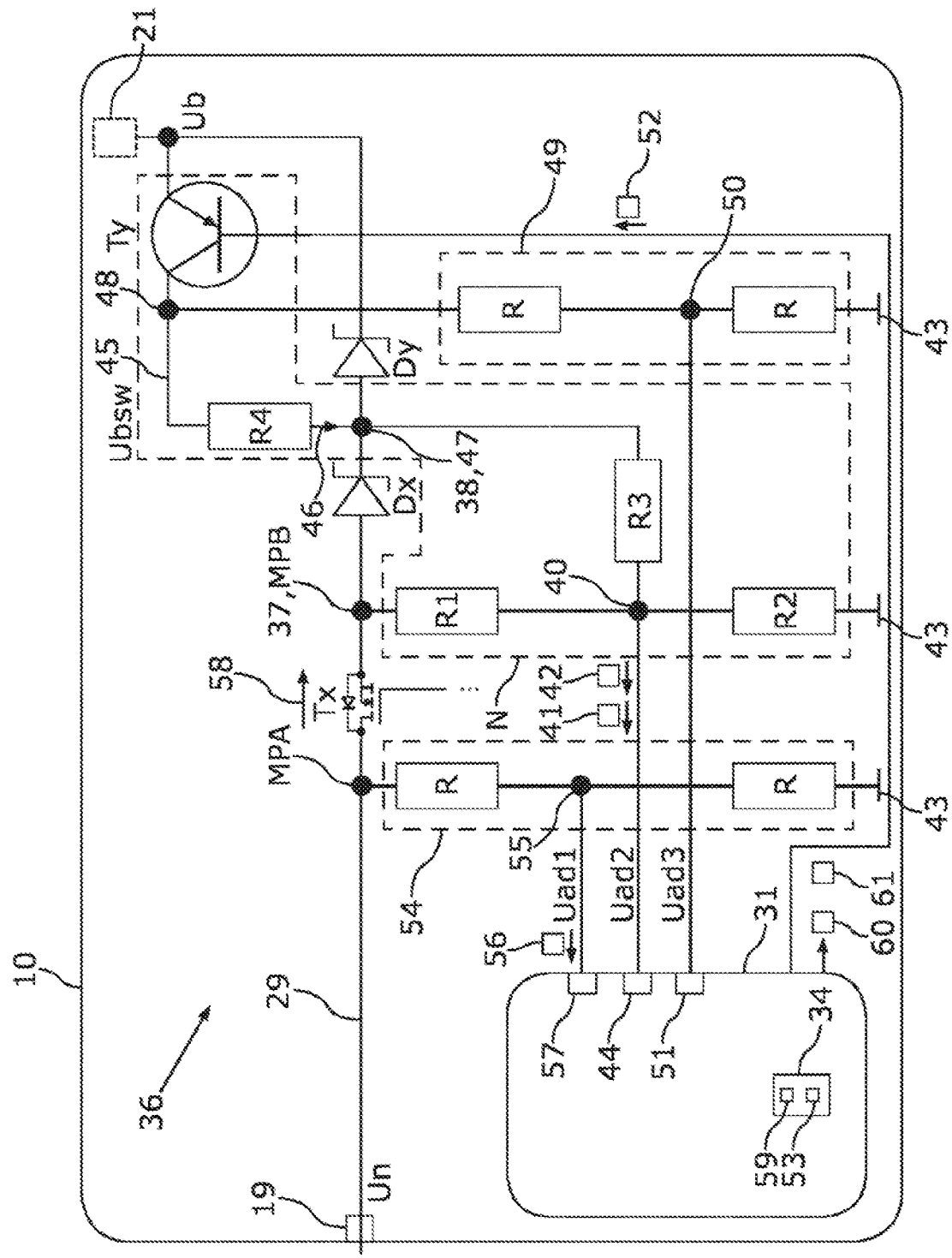
FIG. 2 shows a diagnostic circuit of the control unit from FIG. 1.

FIG. 2 shows a possible embodiment of the diagnostic circuit 36 with the electrical network N. The network N can have a tap point 40 at which the evaluation logic 31 can measure voltage values 41, 42 of a test voltage Uad2 so as thereby to ascertain or verify the respective blocking effect of the blocking elements Dx, Dy singly or individually. The measurement of the voltage values 41, 42 indicates the value of a respective test voltage Uad2 that can be present at the tap point 40 for example with reference to a reference potential 43, for example a ground potential. The measurement of the voltage values 41, 42 can be effected for example by means of an analog-to-digital converter 44.

In this instance the two voltage values 41, 42 can be ascertained as part of or according to the diagnostic routine 34 for two different switching states of the network N, that is to say that there is a voltage value 41, 42 for each switching state. For the purpose of setting the two switching states it is possible for the network N to have a switching element Ty that can be formed for example by a switch or a transistor, for example a bipolar transistor or field-effect transistor. The switching element Ty can interconnect the circuit input 21 with the second contact point 38. To this end, the switching element Ty can be connected to the contact point 38 by means of a circuit branch 45. There can be provision in the circuit branch 45 for a resistor element R4 for weighting and/or current limiting.

The evaluation logic 31 can switch the switching element Ty to an electrically nonconductive state for one switching state and to an electrically conductive state for the second switching state. When the switching element Ty is switched to an electrically conductive state it is possible for a feed current 46 to be fed in between the two blocking elements Dx, Dy, which is why the contact point 38 is a feed point 47. When the switching element Ty is switched to an electrically conductive state it is moreover possible for a feed voltage Ubsw to act in the circuit branch 45, said feed voltage being obtained from the basic supply voltage Ub routed through the switching element Ty switched to an electrically conductive state. In the electrically nonconductive state of the switching element Ty the feed current 46 is blocked.

The tap point 40 can be interconnected with the first contact point 37 via a first resistor element R1, as a result of which a measurement point MPB is obtained. The tap point 40 can be interconnected with the reference potential 43 via a second resistor element R2. The tap point 40 can be interconnected with the feed point 47 via a third resistor element R3. This results in the network N.

To check the switching function or switching capability of the switching element Ty, there can be provision in the circuit branch 45 for a third measurement point 48, which can be connected to the reference potential 43 via a voltage divider 49. The voltage divider 49 can be formed by a series circuit comprising two resistor elements R, between which it is therefore possible for a tap point 50 to be provided, at which the evaluation logic 31 can tap off a feed voltage value Uad3. The feed voltage value Uad3 corresponds or correlates with an electrical feed voltage Ubsw at the measurement point 48. The feed voltage value Uad3 can be ascertained by the evaluation logic 31 by means of an analog-to-digital converter 51. In the case of the switching element Ty switched to an electrically nonconductive state and the interruption element Tx switched to an electrically nonconductive state, the feed voltage value Uad3 corresponds to the reference potential 43. If the feed voltage value Uad3 continues to signal the reference potential 43 even when the switching element Ty is switched to an electrically conductive state, as can be triggered by the evaluation logic 31 by means of a switching signal 52, then the switching element Ty was not able to be successfully switched to an electrically conductive state despite the switching signal 52. Otherwise, if the switching element Ty is operable, the feed voltage Ubsw is obtained at the measurement point 48, and so the feed voltage value Uad3 has a correspondingly different value. This allows the operability of the switching element Ty to be checked by the evaluation logic 31.

By changing over the switching element Ty during the diagnostic routine 34, the evaluation logic 31 can generate the two voltage values 41, 42 at the tap point 40: the voltage value 41 when the switching element Ty is electrically nonconductive and the voltage value 42 when the switching element Ty is switched to an electrically conductive state. The diagnostic routine 34 can comprise a voltage coding 53 indicating the value range in which the voltage values 41, 42 must be in each case if both blocking elements Dx, Dy have their envisaged blocking effect. While the voltage values 41, 42 are being measured, the interruption element Tx can be switched to an electrically nonconductive state.

All in all, the network N acts as a weighted network, for which the voltage coding 53 can be designed or adapted. The network N produces, as voltage values 41, 42, relative or weighted values that relate to the basic supply voltage Ub fed in. This can be ascertained at the tap point 50 when the switching element Ty is switched to an electrically nonconductive state, for which purpose the feed voltage value Uad3 can be converted to the value of the basic supply voltage Ub on the basis of the known resistor elements R of the voltage divider 49.

A further voltage divider 54 can connect the measurement point MPA to the reference potential 43. A further tap point 55 can be provided between resistor elements R of the voltage divider 54, at which further tap point the evaluation logic 31 can record a voltage value 56 of a second test voltage Uad1. The evaluation logic 31 can use an analog-to-digital converter 57 for this purpose. A comparison of the voltage value 56 of the test voltage Uad1 with one of the voltage values 41, 42 of the test voltage Uad2 can be used to ascertain whether a conducting-state voltage 58 dropped across the interruption element Tx corresponds to a value that must be obtained if the interruption element Tx is successfully switched to an electrically conductive state. A corresponding value for the difference between the test voltages Uad1 and Uad2 can be stipulated or defined by a conducting-state criterion 59.

All in all this means that there is therefore the possibility of the evaluation logic 31 monitoring both the blocking elements Dx, Dy and the switching element Ty and the interruption element Tx for the respective operability.

Figure 3:
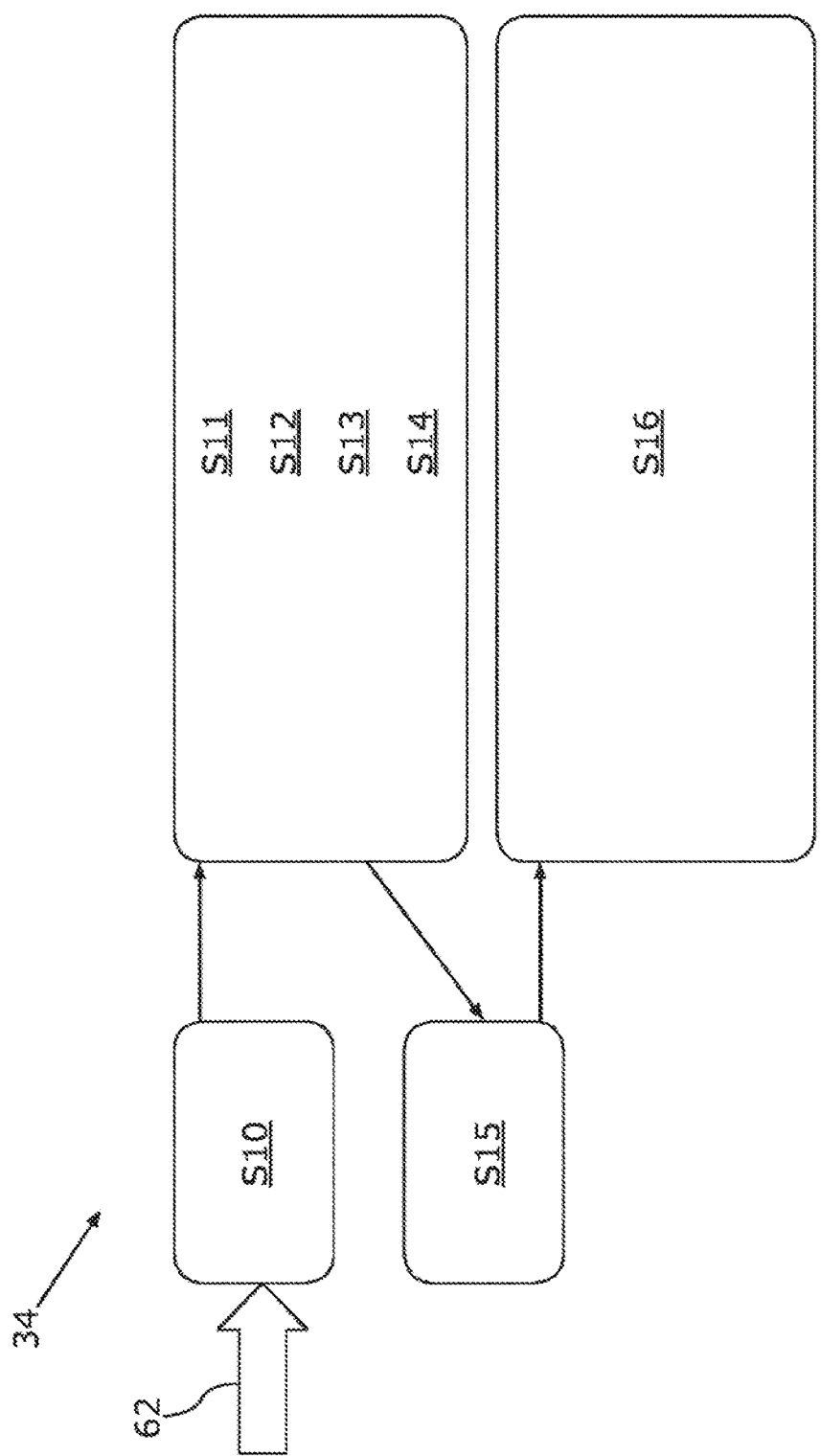
FIG. 3 shows a flow diagram to illustrate a diagnostic routine.

In this regard FIG. 3 once again illustrates a possible design of the diagnostic routine 34, as can be performed by the evaluation logic 31. The steps of the diagnostic routine 34 can be performed by a microcontroller or by multiple microcontrollers, for example the microcontrollers 32, 33.

The diagnostic routine 34 can be begun and/or performed when the control unit 11 powers up or wakes up or starts or starts up, that is to say when operation begins 62 after the motor vehicle 10 is switched on, that is to say for example when the ignition is switched on.

In a step S10 the interruption element Tx can be switched to an electrically nonconductive state. In a step S11 the test voltage Uad1 can be used to perform plausibilization of the measurement point MPA, which can be used to check whether the emergency supply voltage Un is actually present at the emergency supply connection 19. In a step S12, when the interruption element Tx is switched to an electrically nonconductive state and the switching element Ty is switched to an electrically nonconductive state, the blocking element Dy can be checked by virtue of the voltage value 41 at the tap point 40 needing to correspond to the reference potential 43, that is to say a test voltage Uad2 of 0 volt needing to be measured. In a step S13 the switching element Ty can be switched to an electrically conductive state. According to the resistor elements R1, R2, R3, or in general on the basis of the network N, an electrical voltage that is dependent on the blocking effect of the blocking element Dx and is obtained independently of the blocking effect of the blocking element Dy must be obtained at the measurement point MPB, said electrical voltage corresponding to the feed voltage Ubsw fed in, which corresponds to the electrical voltage obtained from the switching element Ty. If, according to the voltage coding, the blocking effect of at least one blocking element Dx, Dy does not exist or is absent, an error signal 60 can be generated (see FIG. 2).

In a step S14 the switching element Ty can be switched to an electrically nonconductive state. In a step S15 the interruption element Tx can be switched to an electrically conductive state. In a step S16 a voltage difference between the test voltages Uad1 and Uad2 can be ascertained, from which the conducting-state voltage across the interruption element Ty is obtained and then the aforementioned conducting-state criterion can be checked or verified. If the conducting-state criterion is not satisfied, a failure signal 61 can be generated. It is then possible in each case for example for a driving mode of the motor vehicle 10 to be terminated or ended and/or for a warning signal to be output to a user of the motor vehicle.

All in all a voltage-coded diagnosis is therefore obtained according to a preferred embodiment, in order to detect a defect in both diodes by means of an analog signal when the transistor Tx is deactivated and the transistor Ty is activated or deactivated.

Moreover, there is the possibility of a plausibility check on the measurement when the transistor Tx is activated and the transistor Ty is deactivated (Uad2 is permitted to be lower than Uad1 only by a predetermined maximum value).

Diagnosis can be made possible from 6 to 20 V.

In the case of one illustrative design of the network N, a threshold between Ub/6 and Ub/5 can suffice for fault detection; for the purposes of distinction, the other thresholds likewise need to be detected. As such, for example the following voltage coding can be provided (when Tx is switched to a nonconductive state):

| Ubsw | Dx  | Dy  | Uad2   | Remark                          |
|------|-----|-----|--------|---------------------------------|
| OFF  | OK  | OK  | 0 V    |                                 |
| OFF  | OK  | NOK | >0 V   |                                 |
| ON   | OK  | OK  | Ubsw/6 |                                 |
| ON   | OK  | NOK | Ubsw/5 | Tested at Ubsw OFF              |
| ON   | NOK | OK  | Ubsw/4 | Δ at 6 V → >440 mV              |
| ON   | NOK | NOK | Ubsw/3 | Δ at 6 V → >900 mV              |

One advantage obtained is in particular the avoidance of common cause faults, i.e. freedom from reaction continues to exist if a diode fails.

In present control units, different supply paths for the logic supply are usually brought together via diodes in order to ensure a certain amount of redundancy in the system.

The diodes prevent crossover currents (reactions) between these supplies.

As soon as the requirement of freedom from reaction in ASIL-C/D is demanded with a short reaction time, these blocking elements need to undergo diagnosis with respect to operability on the basis of the ASIL requirements.

Development of a circuit to prevent reactions between supply lines of a control unit taking into consideration the necessary diagnostic requirements to meet the ASIL-C/D requirements.

The first step is to introduce a switch (e.g. MOSFET, bipolar transistor, etc.) that isolates the respective path to be tested. This allows the functionality of the respective blocking component (e.g. diode) to be checked.

The very short reaction time for the blocking function for freedom from reaction must also be ensured in the event of a single fault in the components involved; dormant faults need to be detected cyclically. This requires a second blocking element in series. This ensures that only a double fault leads to a violation of the freedom from reaction. This can actually be ruled out on the basis of the cyclic diagnosis and the fault rates of the affected components within a driving cycle.

The check on the two blocking elements is performed using a coupled measurement circuit.

Figure 4:
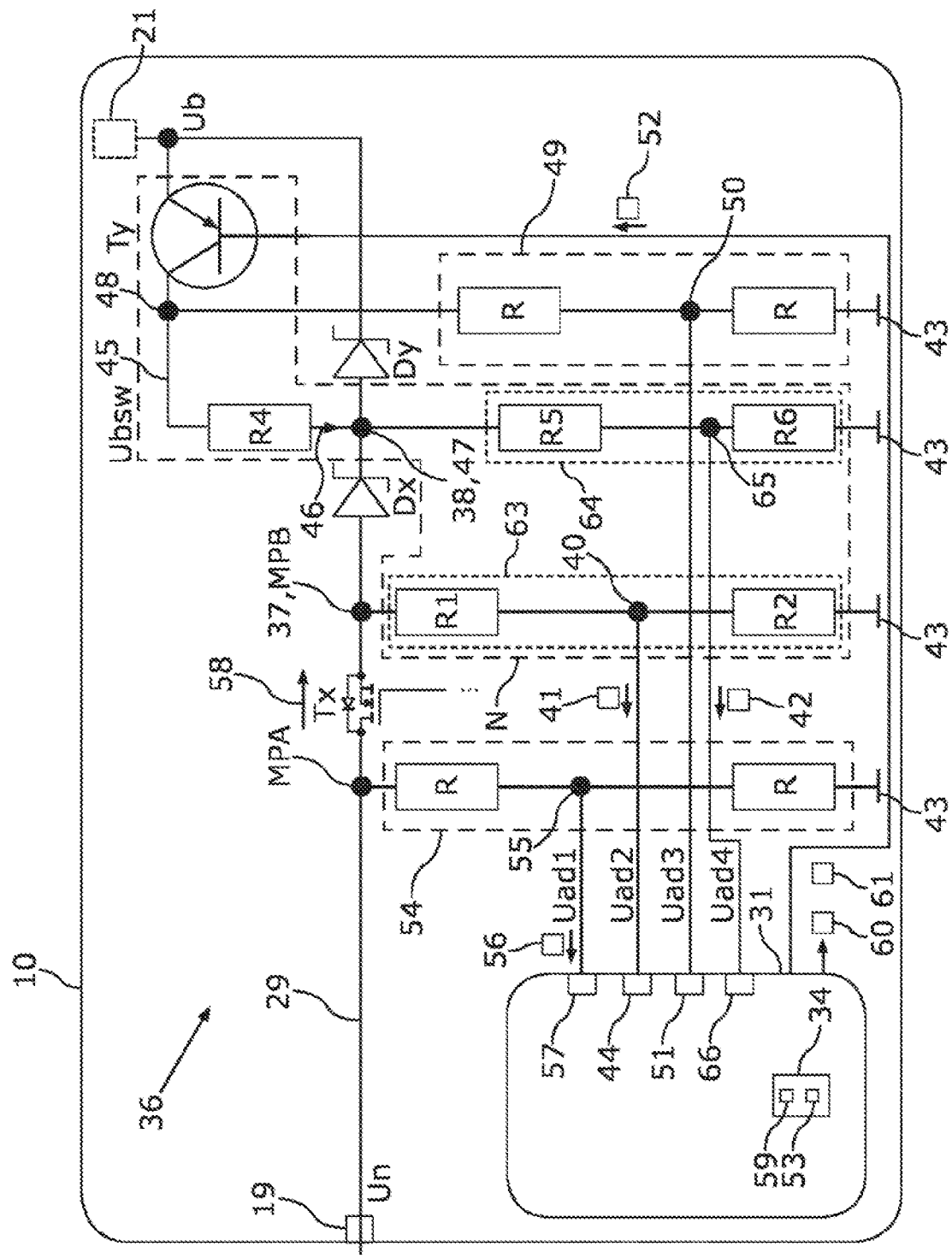
FIG. 4 shows an alternative design of the diagnostic circuit for the control unit from FIG. 1.

FIG. 4 shows an embodiment of the diagnostic circuit 36, in which the network N is of two-part design. In this respect the network N can have two voltage dividers 63, 64. The voltage divider 63 can connect the tap point 40 to the first contact point 37, i.e. to the measurement point MPB, via a resistor element R1 and to the reference potential 43 via a resistor element R2 in the manner described. Only the first voltage value 41 of the test voltage Uad2 then needs to be recorded at the tap point 40.

The voltage divider 64 can provide an additional tap point 65 that can be connected to the second contact point 38, i.e. the feed point 47, via a resistor element R5 and to the reference potential 43 via a resistor element R6. The additional tap point 65 can be provided for the purpose of recording a further test voltage Uad4 and, to this end, can be connected e.g. to an analog-to-digital converter 66 of the evaluation logic 31. The second voltage value 42 can be recorded at the tap point 65.

All in all, the example shows how an aspect of the invention can prevent a time-critical supply reaction by taking into consideration functional safety and diagnostic capability.

LIST OF REFERENCE SIGNS 10 motor vehicle
11 control unit
12 voltage source
13 basic supply line
14 fuse
15 basic supply connection
16 voltage source
17 emergency supply line
18 fuse
19 emergency supply connection
20 device circuit
21 circuit input
22 power supply unit
23 step-up converter
24 inductance
25 diode
26 switching element
27 current path
28 control unit
29 current path
30 OR circuit
31 evaluation logic
32 microcontroller
33 microcontroller
34 diagnostic routine
35 switching signal
36 diagnostic circuit
37 contact point
38 contact point
39 tap point
41 voltage value
42 voltage value
43 reference potential
44 analog-to-digital converter
45 circuit branch
46 current
47 feed point
48 contact point
49 voltage divider
50 tap point
51 analog-to-digital converter
52 switching signal
53 voltage coding
54 voltage divider
55 tap point
56 voltage value
57 analog-to-digital converter
58 conducting-state voltage
59 conducting-state criterion
60 error signal
61 failure signal
62 beginning
63 voltage divider
64 voltage divider
65 tap point
66 analog-to-digital converter
Dx blocking element
Dy blocking element
Tx interruption element
N electrical network
C1 capacitance
D1-D3 blocking element
Ub basic supply voltage
Un emergency supply voltage
Ubsw feed voltage
MPA, MPB measurement point
Uad1 test voltage
Uad2 test voltage
Uad3 feed voltage value
R, R1, R2, R3 resistor element
R4, R5, R6 resistor element

The invention claimed is:

1. A control unit for a motor vehicle, having at least one supply connection for receiving a supply voltage from a respective supply line needing to be secured against a predetermined electrical reaction from the control unit, wherein the at least one supply connection is connected via a respective current path to a circuit input of an electrical device circuit of the control unit, and to protect against the reaction there is provision for, in the respective current path of the at least one supply connection, a respective unidirectional first blocking element that provides for a unidirectionally directed flow of current to the device circuit and a blocking effect for a flow of current to the respective supply connection, wherein a diagnostic circuit is configured to check the blocking effect by a predetermined diagnostic routine, wherein a second unidirectional blocking element is respectively connected in series with the first blocking element in the respective current path of the at least one supply connection, wherein the second blocking element likewise provides for the unidirectional flow of current to the device circuit, and the diagnostic circuit is configured to use the diagnostic routine to also check the blocking effect of the second blocking element.

2. The control unit as claimed in claim 1, wherein the diagnostic circuit for the respective current path of the at least one supply connection has an electrical network in each case via which the circuit input is connected to a reference potential of the control unit, and the diagnostic routine involves an evaluation logic of the diagnostic circuit using a switching element of the network to set two different switching states in the network and, in each of the switching states, recording at least one voltage value obtained in the respective switching state for a respective electrical first test voltage of the network at at least one predetermined first tap point and using the voltage values to verify, according to a predetermined voltage coding, whether the first and the second blocking element has its respective blocking effect, and otherwise generating an error signal.

3. The control unit as claimed in claim 2, wherein the circuit input is electrically connected to the reference potential in both switching states of the network.

4. The control unit as claimed in claim 2, wherein the network is connected to the current path at at least two contact points, and a first of the contact points is arranged between firstly the two blocking elements and secondly the supply connection and the second of the contact points is arranged between the two blocking elements.

5. The control unit as claimed in claim 4, wherein a first tap point in the network is connected to a first measurement point of the current path, corresponding to the first contact point, via a first resistor element and to the reference potential via a second resistor element.

6. The control unit as claimed in claim 3, wherein the switching element connects the circuit input to a feed point corresponding to the second contact point.

7. The control unit as claimed in claim 6, wherein the diagnostic routine involves the evaluation logic recording a feed voltage value when the switching element is switched to an electrically conductive state, which feed voltage value correlates with a feed voltage that is present in a circuit branch that comprises the switching element and connects the circuit input to the feed point, and configuring the voltage coding on the basis of the recorded feed voltage value.

8. The control unit as claimed in claim 6, wherein the first tap point is connected to the feed point via a third resistor element or wherein there is provision for a further first tap point that is connected to the feed point via a fifth resistor element and to the reference potential via a sixth resistor element.

9. The control unit as claimed in claim 2, wherein the diagnostic circuit for the respective current path of the at least one supply connection provides for an interruption element of switchable design, provided between firstly the supply connection and secondly the two blocking elements, in the current path in each case, wherein the diagnostic routine provides for the blocking effect to be checked by virtue of the interruption element being switched to an electrically nonconductive state for at least part of the diagnostic routine.

10. The control unit as claimed in claim 9, wherein a second measurement point, arranged between the supply connection and the interruption element, of the current path is connected to the evaluation logic, and the diagnostic routine involves the evaluation logic, when the interruption element is switched to an electrically conductive state, checking a conducting-state voltage dropped across the interruption element for whether the conducting-state voltage satisfies a predetermined conducting-state criterion, and generating a failure signal if the conducting-state criterion is violated.

11. The control unit as claimed in claim 10, wherein the diagnostic circuit has a voltage divider, connecting the second measurement point and the reference potential, that provides a second tap point, and the conducting-state criterion involves a voltage difference between a second test voltage recorded at the second tap point and the first test voltage being lower than a predetermined threshold value.

12. The control unit as claimed in claim 2, wherein the evaluation logic is configured to perform the diagnostic routine while the control unit is starting and to refrain from the diagnostic routine while the control unit is operating.

13. The control unit as claimed in claim 2, wherein the evaluation logic is provided on the basis of at least one microcontroller, and the evaluation logic is configured to use at least one AD converter of the at least one microcontroller for a voltage recording provided for according to the diagnostic routine.

14. The control unit as claimed in claim 1, wherein the blocking elements are in each case a diode and/or a MOSFET with body diode and/or a switching unit that is designed to be alternately switchable to an electrically conductive state and an electrically nonconductive state.

15. A motor vehicle having at least one electrical supply line and at least one control unit as claimed in claim 1, wherein the at least one control unit is connected to the at least one supply line for an electrical supply.

16. The control unit as claimed in claim 3, wherein the network is connected to the current path at at least two contact points, and a first of the contact points is arranged between firstly the two blocking elements and secondly the supply connection and the second of the contact points is arranged between the two blocking elements.

17. The control unit as claimed in claim 4, wherein the switching element connects the circuit input to a feed point corresponding to the second contact point.

18. The control unit as claimed in claim 7, wherein the first tap point is connected to the feed point via a third resistor element or wherein there is provision for a further first tap point that is connected to the feed point via a fifth resistor element and to the reference potential via a sixth resistor element.

19. The control unit as claimed in claim 1, wherein a cathode of the first blocking element is directly connected to an anode of the second blocking element.

\* \* \* \* \*